United States Patent
Wang

(10) Patent No.: US 8,587,380 B2
(45) Date of Patent: *Nov. 19, 2013

(54) SATURATION PROTECTION OF A REGULATED VOLTAGE

(75) Inventor: Lige Wang, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/557,080

(22) Filed: Jul. 24, 2012

(65) Prior Publication Data

US 2013/0049859 A1  Feb. 28, 2013

Related U.S. Application Data

(63) Continuation of application No. 13/212,453, filed on Aug. 18, 2011, now Pat. No. 8,248,163, which is a continuation of application No. 12/788,568, filed on May 27, 2010, now Pat. No. 8,022,770.

(51) Int. Cl.
    *H03F 3/04* (2006.01)

(52) U.S. Cl.
    USPC .......................................... 330/297; 330/296

(58) Field of Classification Search
    USPC ................ 330/297, 285, 296, 85, 98
    See application file for complete search history.

(56) References Cited

U.S. PATENT DOCUMENTS

| | | | | |
|---|---|---|---|---|
| 6,388,433 B2 * | 5/2002 | Marty | | 323/284 |
| 6,501,253 B2 * | 12/2002 | Marty | | 323/280 |
| 7,106,137 B2 | 9/2006 | Dupuis et al. | | |
| 7,142,053 B2 | 11/2006 | Phillips et al. | | |
| 7,173,491 B2 | 2/2007 | Bocock et al. | | |
| 7,288,991 B2 | 10/2007 | Ripley | | |
| 7,402,987 B2 * | 7/2008 | Lopata | | 323/282 |
| 7,408,413 B2 | 8/2008 | Ripley | | |
| 7,551,032 B2 | 6/2009 | Dupuis et al. | | |
| 7,583,149 B2 | 9/2009 | Funaki et al. | | |
| 7,683,592 B2 * | 3/2010 | Soude et al. | | 323/275 |
| 7,705,580 B2 * | 4/2010 | Okahara et al. | | 323/286 |
| 7,777,466 B2 * | 8/2010 | Crippa et al. | | 323/282 |
| 7,808,323 B2 | 10/2010 | Takinami et al. | | |
| 7,839,218 B2 | 11/2010 | Shimamoto et al. | | |
| 8,018,287 B2 | 9/2011 | Shimamoto et al. | | |
| 8,334,681 B2 * | 12/2012 | Arigliano | | 323/282 |
| 2007/0273340 A1 * | 11/2007 | Miller et al. | | 323/224 |
| 2009/0289720 A1 | 11/2009 | Takinami et al. | | |
| 2010/0105448 A1 | 4/2010 | Andrys et al. | | |

FOREIGN PATENT DOCUMENTS

| | | |
|---|---|---|
| JP | 2009-100197 | 5/2009 |
| KR | 10-2007-0074661 | 7/2007 |
| KR | 10-2007-0093088 | 9/2007 |

OTHER PUBLICATIONS

PCT Search Report of Nov. 30, 2011 from the International Searching Authority for International Application No. PCT/US2011/030510 filed on Mar. 30, 2011, in 8 pages.

* cited by examiner

*Primary Examiner* — Henry Choe
(74) *Attorney, Agent, or Firm* — Knobbe, Martens, Olson & Bear, LLP

(57) ABSTRACT

A system for preventing power amplifier supply voltage saturation includes a multiple stage voltage regulator configured to provide a regulated voltage, a power amplifier configured to receive the regulated voltage, and a saturation protection circuit configured to apply a current into a first stage of the multiple stage voltage regulator when the regulated voltage reaches a reference voltage, the applied current causing a subsequent stage of the multiple stage voltage regulator to prevent the regulated voltage from exceeding the reference voltage.

21 Claims, 5 Drawing Sheets

SATURATION PROTECTION OF A REGULATED VOLTAGE

RELATED APPLICATIONS

This application is a continuation of U.S. patent application Ser. No. 13/212,453, filed Aug. 18, 2011, which is a continuation of U.S. patent application Ser. No. 12/788,568, filed May 27, 2010, issued as U.S. Pat. No. 8,022,770 on Sep. 20, 2011, the disclosures of each of which are hereby incorporated by reference in their entireties herein.

BACKGROUND OF THE INVENTION

Portable communication devices, such as cellular telephones, personal digital assistants (PDAs), WiFi transceivers, and other communication devices transmit and receive communication signal at various frequencies that correspond to different communication bands and at varying power levels. Each of these devices uses a power amplifier to amplify the information signal for over-the-air transmission. One such power amplifier topology is referred to a collector voltage amplitude controller (COVAC). One technology used to implement a COVAC power amplifier uses one or more bipolar junction transistor (BJT) or heterojunction bipolar transistor (HBT) stages to implement the power amplifier, while the supply voltage is provided to the collector of the power amplifier using control circuitry that can be fabricated using a complementary metal oxide semiconductor (CMOS) process. In an implementation, the collector of a COVAC power amplifier is connected through an inductor (a radio frequency (RF) choke) to the drain of a p-type field effect transistor (PFET) which is controlled by an external control voltage, Vapc, applied to a comparator. The comparator also receives a power feedback signal, Vfb, and the resulting output of the comparator is applied to the gate of the PFET.

When used in a voltage regulator, the PFET is sometimes referred to as a "pass" transistor. The comparator and the pass transistor form a voltage regulator that provides a regulated voltage, Vreg, at the drain of the PFET. The source of the PFET is connected to a supply voltage (often the DC power source (e.g., the battery) of the portable communication device) and the comparator output applied to the gate influences the amount current that flows from the source to the drain of the PFET, thereby controlling the power output of the COVAC power amplifier.

The output, Vreg, of the voltage regulator increases linearly with the external control voltage, Vapc, regardless of power amplifier load conditions. As the battery voltage drops, the drain to source voltage, Vds, of the PFET transistor is reduced. When Vds of the PFET is reduced below its minimum saturation level, the PFET is pushed into triode operating mode and the voltage regulator might no longer be able to supply the voltage needed for the desired output power. Furthermore, when the PFET is in the triode mode, Vreg can no longer be controlled and the regulator has become "saturated". Since output power is directly controlled by the regulated voltage, Vreg, once the voltage regulator goes into saturation, power spectrum is degraded and large switching transients are generated. These switching transients can violate time mask and switching transient requirements.

A previous solution to prevent voltage saturation for a COVAC power amplifier entailed applying a clamp voltage to a third input of the comparator. The clamp voltage is relatively easy to determine because a fixed relationship exists between the regulated voltage and a power control signal. However, there are other implementations of a COVAC power amplifier where the ratio between the regulated voltage and the power control signal can vary with power amplifier load, thus making it difficult to calculate an equivalent power control signal value to prevent the regulated voltage from exceeding a set threshold.

Therefore, there is a need for voltage saturation protection in an implementation of a COVAC power amplifier where the ratio between the regulated voltage and the power control signal can vary with power amplifier load.

SUMMARY OF THE INVENTION

Embodiments of a system for preventing power amplifier supply voltage saturation include a multiple stage voltage regulator configured to provide a regulated voltage, a power amplifier configured to receive the regulated voltage, and a saturation protection circuit configured to apply a current into a first stage of the multiple stage voltage regulator when the regulated voltage reaches a reference voltage, the applied current causing a subsequent stage of the multiple stage voltage regulator to prevent the regulated voltage from exceeding the reference voltage.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION OF THE PREFERRED EMBODIMENT

Although described with particular reference to a portable communication device, such as a portable cellular telephone or a personal digital assistant (PDA), the system and method for preventing power amplifier supply voltage saturation can be used in any device or system that has a COVAC power amplifier. The system and method for preventing power amplifier supply voltage saturation can be implemented as part of an integrated module that contains other circuit elements, or can be implemented as a discrete circuit within a power amplification control module.

In an embodiment, the system and method for preventing power amplifier supply voltage saturation can be implemented in hardware. The hardware implementation of the system and method for preventing power amplifier supply voltage saturation can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
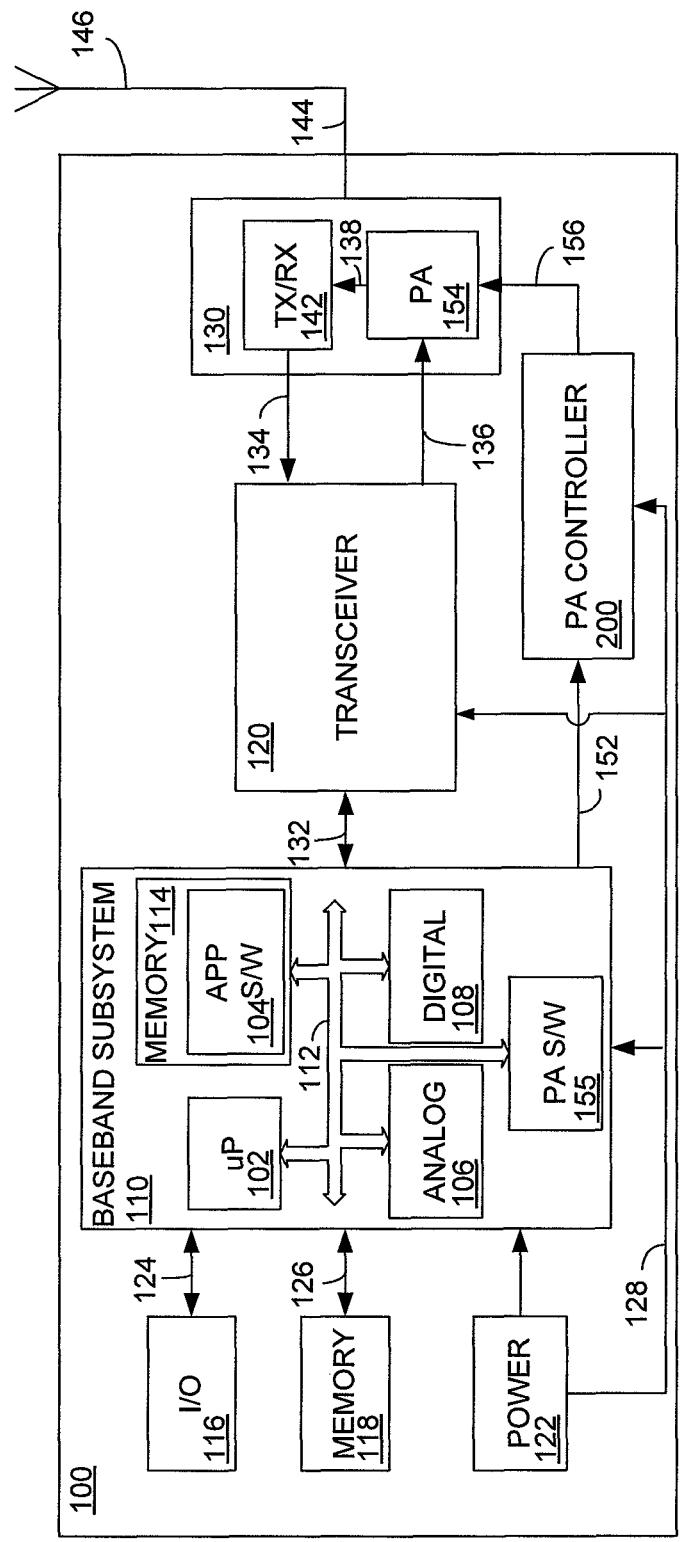
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the system and method for preventing power amplifier supply voltage saturation can be implemented in any device having an RF power amplifier, and in this example, are implemented in a portable communication device 100. The portable communication device 100 illustrated in FIG. 1 is intended to be a simplified example of a cellular telephone and to illustrate one of many possible applications in which the system and method for preventing power amplifier supply voltage saturation can be implemented. One having ordinary skill in the art will understand the operation of a portable cellular telephone, and, as such, implementation details are not shown herein. The portable communication device 100 includes a baseband subsystem 110, a transceiver 120, a front end module (FEM) 130 and a power amplifier controller 200. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110, transceiver 120 and power controller 200 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile memory, non-volatile memory, or a combination thereof, and in an embodiment, can include flash memory. The memory element 118 can be permanently installed in the portable communication device 100, or can be a removable memory element, such as a removable memory card, or a combination of fixed and removable memory.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile memory, non-volatile memory, or a combination thereof, and in an embodiment, can be non-volatile memory that stores the application software 104. If portions of the system and method for preventing power amplifier supply voltage saturation are implemented in software, then the baseband subsystem 110 also includes power amplifier software 155 that can be executed by the microprocessor 102, or by another processor, which may cooperate with control logic to control the operation of at least portions of the power amplifier 154 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 154. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 154. The output of the power amplifier 154 is provided over connection 138 to the TX/RX switch 142, and then to an antenna 146 over connection 144.

The power amplifier controller 200 includes circuitry and logic that controls the power output of the power amplifier 154. In an embodiment, the power amplifier controller 200 receives a power control signal, which can be referred to as Vapc, from the baseband subsystem 110 over connection 152. The power control signal on connection 152 can be implemented in a variety of ways, and generally comprises an analog or a digital control signal that allows the power amplifier controller 200 to set the power of an output signal from the power amplifier 154. In an embodiment, the power amplifier controller 200 also includes a voltage saturation protection circuit that prevents saturation of the circuitry that controls the power output of the power amplifier 154. Embodiments of the power amplifier controller 200 will be described in greater detail below.

A signal received by the antenna 146 is provided over connection 144 to the TX/RX switch 142, which provides the received signal over connection 134 to the transceiver 120.

Figure 2:
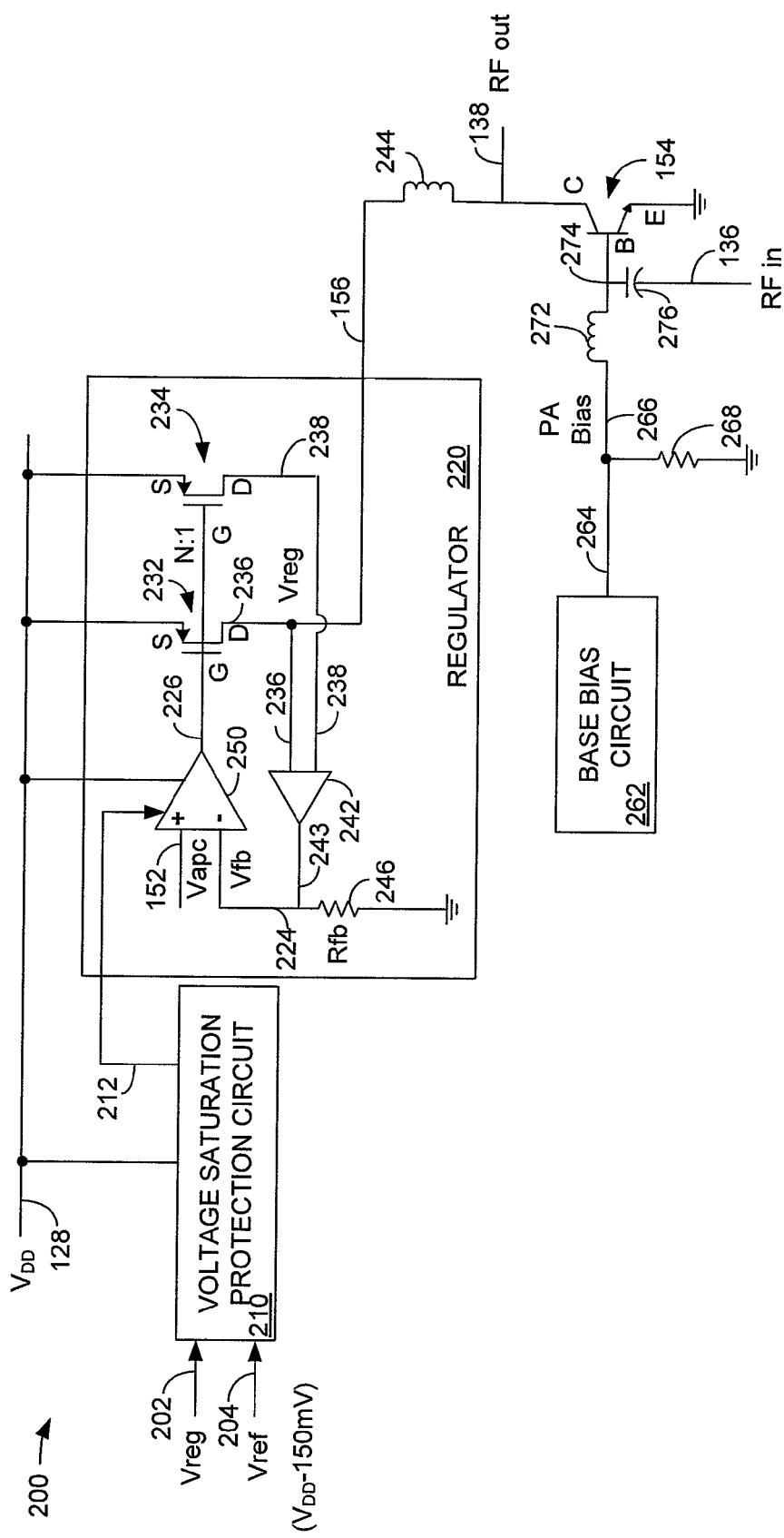
FIG. 2 is a diagram illustrating an embodiment of the power amplifier and power amplifier controller of FIG. 1.

FIG. 2 is a diagram illustrating an embodiment of the power amplifier and power amplifier controller of FIG. 1. FIG. 2 illustrates only the portions of the power amplifier controller 200 that are relevant to the description of the system and method for preventing power amplifier supply voltage saturation. The power amplifier controller 200 includes a voltage regulator 220, which is coupled to the collector of the power amplifier 154 through an inductor 244. The inductor 244 functions as a radio frequency (RF) choke.

The voltage regulator 220 includes a comparator 250, a multiplier 242 and transistors 232 and 234. The comparator 250 is connected to system voltage, $V_{DD}$, on connection 128 from power source 122, receives a power control signal, Vapc, from the baseband subsystem 110 over connection 152 at a non-inverting input and receives a feedback signal over connection 243 at an inverting input 224. In an embodiment, the comparator 250 can be implemented with an operational amplifier which develops an error signal on connection 226 that represents the difference between the inverting and non-inverting inputs. When the voltage on connection 224 approaches the voltage on connection 152, the output of the comparator 250 tends to approach zero. As the output of the comparator 250 drops, the transistor 232 becomes more conductive, thereby increasing the regulated voltage, Vreg. As will be described in greater detail below, the comparator 250 can be implemented with multiple stages. The error signal on connection 226 is provided to the gates of the transistors 232 and 234.

The transistor 232 and the transistor 234 can each be implemented as a p-type field effect transistor (PFET), and generally have a ratio of N:1, meaning that the transistor 232 is "N" times larger than the transistor 234. In an embodiment, the transistor 232 can be 400 times larger than the transistor 234, but this ratio is exemplary and other ratios are possible. The lower the ratio between the transistors 232 and 234, the closer the value of the main current flowing through the transistor 232 will be to the value of the mirrored current flowing through the transistor 234. However, the lower the ratio, the higher the mirrored current, thereby increasing overall current consumption. The source of each transistor 232 and 234 is connected to the system voltage, $V_{DD}$, on connection 128.

The transistor 232 is referred to as a "pass" transistor. The regulated output voltage, Vreg, on the drain of the transistor 232 is connected to the collector of the power amplifier 154 through the inductor 244. The regulated output voltage, Vreg, is also coupled to one input of the multiplier 242. The drain of the transistor 234 is connected to another input of the multiplier 242. The multiplier computes the product of Vreg on connection 236 and the current on connection 238 that flows out of the drain of transistor 234 that mirrors the current flowing out of transistor 232 and scaled by a factor of approximately 1:N. The output of the multiplier 242 on connection 243 is coupled to a feedback resistor 246 and is also provided to the inverting input 224 of the comparator 250. The voltage, Vfb, across the feedback resistor 246 represents, with a scaling factor corresponding to the N:1 relationship between the transistors 232 and 234, the product of power amplifier collector voltage and current, which is the DC power being delivered to the collector of the power amplifier 154 from the power amplifier controller 200. The feedback loop comprising the transistors 232 and 234, the multiplier 242 and the resistor 246 establishes a relationship between the power control voltage Vapc, and the DC power delivered to the power amplifier 154, which, in turn, allows the output power of the power amplifier 154 to be controlled by Vapc by operation of the feedback loop through the comparator 250.

In a previous solution to prevent voltage saturation for a COVAC power amplifier that uses a fixed feedback ratio, a clamp voltage was applied to a third input of the comparator. In such implementations, the relationship between the regulated voltage and the power control signal is fixed. To limit the regulated voltage within some headroom margin of battery voltage, a corresponding power control signal voltage can be calculated based on the fixed relationship between the regulated voltage and the power control signal, such that the regulated voltage will not exceed a preset level. The calculated power control signal voltage was applied to the third input of the comparator. However, there are other implementations of a COVAC power amplifier where the ratio between the regulated voltage and the power control signal may vary with power amplifier load, thus making it difficult to calculate an equivalent power control signal value to prevent the regulated voltage from exceeding a set threshold.

To overcome the above-mentioned difficulty, the power amplifier controller 200 also includes an embodiment of a voltage saturation protection circuit 210. The voltage saturation protection circuit 210 is connected to the system voltage, $V_{DD}$, over connection 128, receives the regulated voltage, Vreg, from node 236 over connection 202 and receives a reference voltage, Vref, over connection 204. The reference voltage, Vref, is typically established at a level that is somewhat less than the system voltage, $V_{DD}$. In an embodiment, the system voltage, $V_{DD}$, is a nominal 3.5V and the reference voltage, Vref, is approximately $V_{DD}$–150 mV. In an embodiment, the approximate value of 150 mV below $V_{DD}$ is chosen such that the pass transistor 232 does not enter the "triode" mode of operation, where its gain degrades drastically and Vreg (and, therefore, RF output of amplifier 154) is no longer controlled by the feedback loop comprising the transistors 232 and 234, the multiplier 242 and the feedback resistor 246, resulting in large switching transients. The approximate 150 mV value is chosen based on a particular implementation. However, other reference voltage levels may be implemented, depending on system parameters and requirements. The reference voltage, Vref, can be generated using circuitry that is not shown, but known to those skilled in the art.

In an embodiment, as the regulated voltage, Vreg, approaches the reference voltage, Vref, the voltage saturation protection circuit 210 develops a current, referred to as an "offset current," Ioffset, which is applied to a first stage of the comparator 250 over connection 212. The offset current, Ioffset, flowing into the voltage regulator 220 causes the voltage on connection 226 to rise, thereby reducing the conductivity of the PFET transistor 232 and preventing the regulated voltage, Vreg, from increasing when Vreg is equal to Vref. As will be described in greater detail below, the offset current, Ioffset, is supplied only to a first stage of the comparator 250, thus allowing the feedback loop comprising the multiplier 242 and feedback resistor 246 to maintain a linear loop gain when the voltage saturation protection circuit is operating to limit Vreg.

The power amplifier 154 also receives a base bias current signal from bias circuit 262. The bias circuit 262 includes circuitry that is well known to those skilled in the art and provides a bias current to connection 264, which is provided through the inductor 272 to the base 274 of the power amplifier 154. Although shown as a single transistor, the power amplifier 154 is typically implemented using a number of amplifier stages. In a typical implementation, a transistor output stage is driven by one or two driver stages, each of which receive the power amplifier bias current signal at their base terminals on connection 274, while the output stage of the power amplifier 154 is provided as a third stage. However, all such multiple and single stage implementations are considered within the scope of this description.

A radio frequency (RF) input signal is provided from connection 136, through a DC blocking capacitor 276 to the base terminal 274 of the power amplifier 154. The collector terminal of the power amplifier 154 provides the radio frequency output signal on connection 138.

Figure 3:
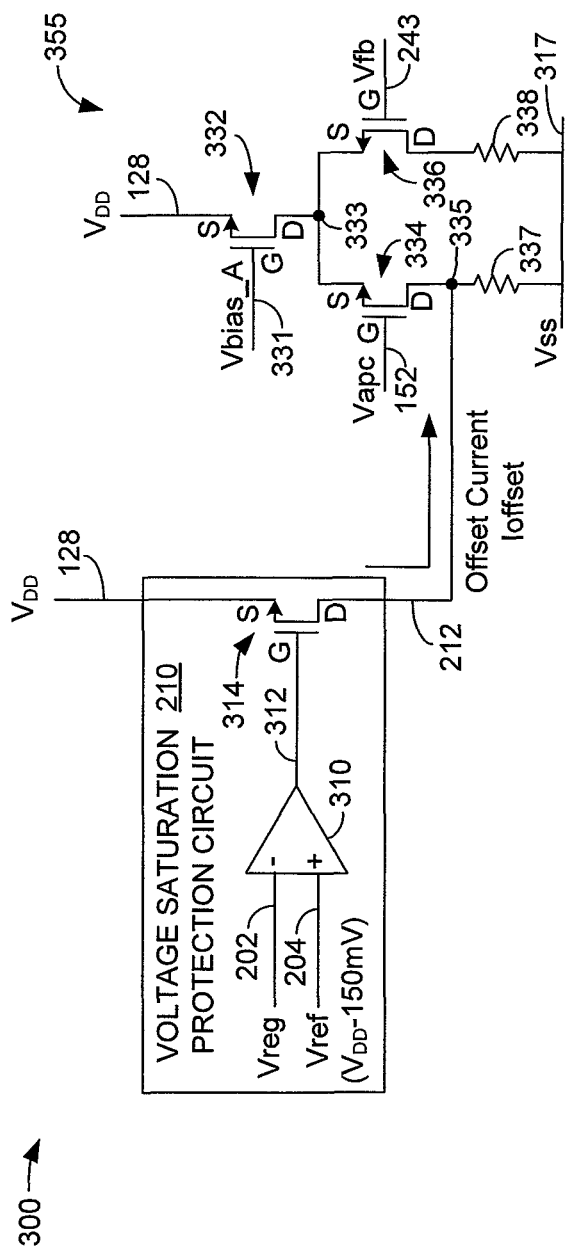
FIG. 3 is a diagram illustrating an embodiment of the voltage saturation protection circuit and a first stage of the voltage regulator of FIG. 2.

FIG. 3 is a diagram illustrating an embodiment of the voltage saturation protection circuit 210 and a first stage of the comparator 250 in the voltage regulator 220 of FIG. 2. The voltage saturation protection circuit 210 comprises a comparator 310 and a transistor 314.

The comparator 310 can be implemented with an operational amplifier having an inverting input that receives the regulated voltage, Vreg, and a non-inverting input that receives the reference voltage, Vref. The output of the comparator 310 is an error signal on connection 312 that represents the difference between the inverting and non-inverting inputs.

The transistor 314 can be similar to the transistor 232 and has its source connected to the system voltage, $V_{DD}$. The gate of the transistor 314 receives the output of the comparator 310 on connection 312. The drain of the transistor 314 is coupled to a first stage 355, which is the input stage, of the comparator 250 of FIG. 2.

The first stage 355 comprises transistors 332, 334 and 336, which are PFET devices similar to the transistor 232 of FIG. 2. The source of the transistor 332 is connected to the system voltage, $V_{DD}$, over connection 128. The gate of the transistor 332 receives a bias voltage, referred to as "Vbias_A" over connection 331. In an embodiment, the bias voltage applied to connection 331 is approximately 2.4V. Thus, transistor 232 operates as a fixed current source. The sources of the transistors 334 and 336 are coupled to the drain of the transistor 332 at node 333. The drain of the transistor 334 is connected to system ground, $V_{SS}$, 317 through a resistor 337, and the drain of the transistor 336 is connected to system ground, $V_{SS}$, 317 through a resistor 338. The gate of the transistor 334 receives the power control signal, Vapc, and the gate of the transistor 336 receives the feedback signal, Vfb. In this embodiment, transistors 334 and 336 form a differential amplifier.

In accordance with the system and method for preventing power amplifier supply voltage saturation, as the regulated voltage, Vreg, approaches the reference voltage, Vref, the output of the comparator 310 on connection 312 causes the transistor 314 to conduct, thereby developing the offset current, Ioffset, on connection 212. The offset current, Ioffset, flowing into the resistor 337 increases the voltage at node 335, and will increase the current in subsequent stages of the comparator 250, as will be described below.

Figure 4:
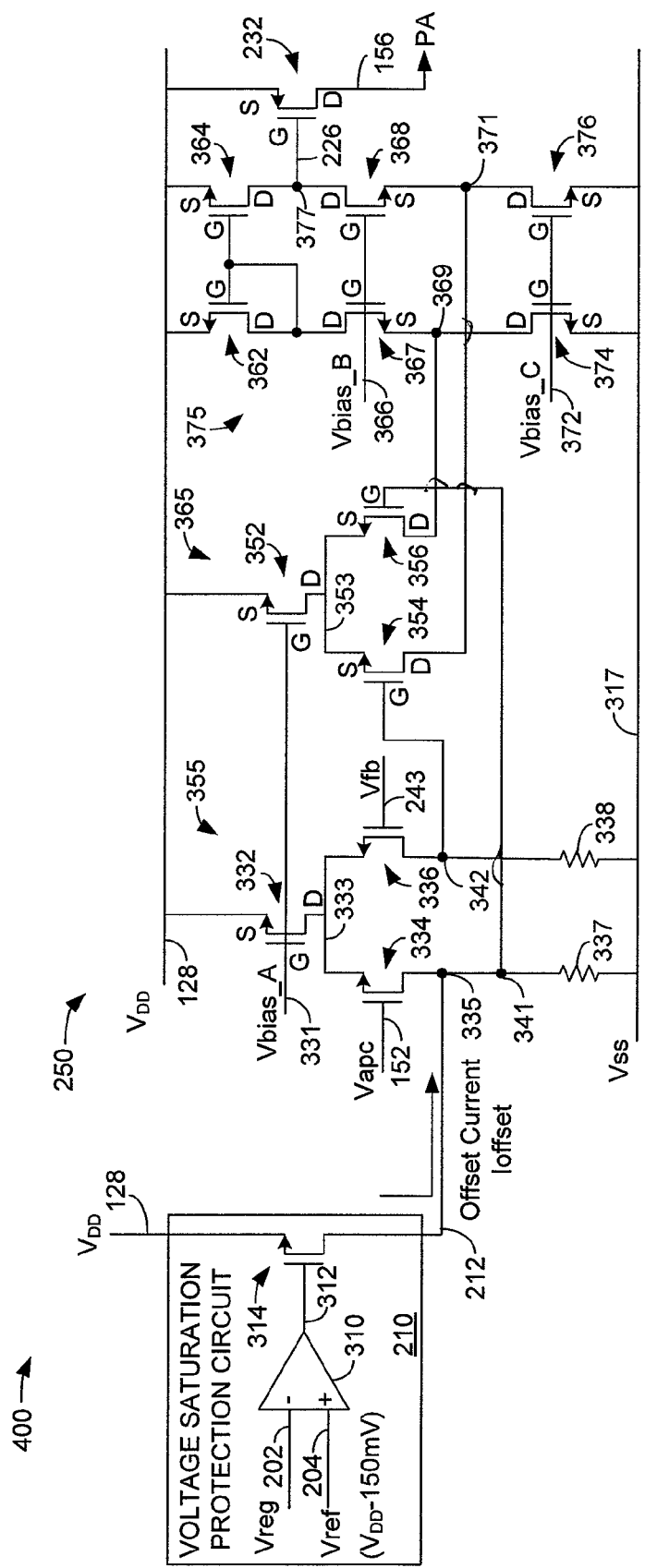
FIG. 4 is a diagram illustrating an embodiment of the voltage saturation protection circuit and voltage regulator of FIG. 2.

FIG. 4 is a diagram illustrating an embodiment of the voltage saturation protection circuit and voltage regulator of FIG. 2. The comparator 250 includes a first stage 355, a second stage 365 and a third stage 375. The first stage 355 is identical to the first stage 355 described in FIG. 3. The second stage 365 comprises transistors 352, 354 and 356, which are PFET devices similar to the transistor 232 of FIG. 2. The source of the transistor 352 is connected to the system voltage, $V_{DD}$, over connection 128. The gate of the transistor 352 receives the bias voltage, referred to as "Vbias_A" over connection 331. The sources of the transistors 354 and 356 are coupled to the drain of the transistor 352 on connection 353.

The gate of the transistor 354 is coupled to the drain of the transistor 336 at node 342. The gate of the transistor 356 is coupled to the drain of the transistor 334 at node 341. The node 341 receives the offset current, Ioffset, which is used to control the conductivity of the transistor 356. The offset current, Ioffset, causes the voltage at the gate of the transistor 356 to increase, thus increasing the current flowing in the transistor 356.

The third stage 375 comprises transistors 362, 364, 367, 368, 374 and 376, which are PFET devices similar to the transistor 232 of FIG. 2. The source of the transistor 362 and the source of the transistor 364 are connected to the system voltage, $V_{DD}$, over connection 128.

The drain of the transistor 362 is connected to the gate of the transistor 362 and to the gate of the transistor 364. The drain of the transistor 362 is also connected to the drain of the transistor 367. The drain of the transistor 364 is connected to the drain of the transistor 368. The gate of the transistor 367 and the gate of the transistor 368 are connected to a bias signal, Vbias_B, on connection 366. In an embodiment, the value of Vbias_B is approximately 1.6V.

The source of the transistor 367 is connected to the drain of the transistor 374; and the source of the transistor 368 is connected to the drain of the transistor 376. The gate of the transistor 374 and the gate of the transistor 376 are connected to a bias signal, Vbias_C, on connection 372. In an embodiment, the value of Vbias_C is approximately 1.0V. The source of the transistor 374 is connected to system ground, $V_{SS}$, 317 and the source of the transistor 376 is connected to system ground, $V_{SS}$, 317. Thus, transistors 374 and 376 operate as fixed current sources.

The drain of the transistor 354 is connected to the drain of the transistor 376 at node 371. The drain of the transistor 356 is connected to the drain of the transistor 374 at node 369. The node 377 between the drain of the transistor 364 and the drain of the transistor 368 is connected to the gate of the pass transistor 232.

The offset current, Ioffset, is generated by the transistor 314 when Vreg approaches Vref ($V_{DD}$–150 mV), and flows into the resistor 337. The voltage on the resistor 337 at node 341 rises, which causes the gate voltage of transistor 356 to rise. An increase in the gate voltage of the transistor 356 causes its drain current to decrease, which results in less current flowing into node 369. The voltage at node 369 then decreases, which causes the source voltage of the transistor 367 to also decrease and, because the transistor 367 is configured as a cascode device, its drain current increases, increasing the current flowing in transistor 362. This, in turn, causes an increase in current through transistor 364 that results in node 377 increasing in voltage. Because the node 377 is connected to the gate of the PFET pass transistor 232, its drain current decreases. This causes the voltage on connection 156, Vreg, to decrease, limiting Vreg to approximately Vref, which is approximately $V_{DD}$–150 mV in this example.

Applying the offset current, Ioffset, into the first stage 355 allows the second stage 365 and the third stage 375 to preserve the feedback loop gain even when the voltage at node 377 causes the transistor 232 to clamp Vreg. The loop gain provided by the second stage 365 and third stage 375 aids in maintaining Vreg at approximately 150 mV below $V_{DD}$, in this example. By applying the offset current, Ioffset, only to the first stage 355 of the comparator 250, the feedback loop comprising the multiplier 242 and feedback resistor 246 (FIG. 2) maintain the loop gain while the voltage saturation protection circuit is operating to limit Vreg.

Figure 5:
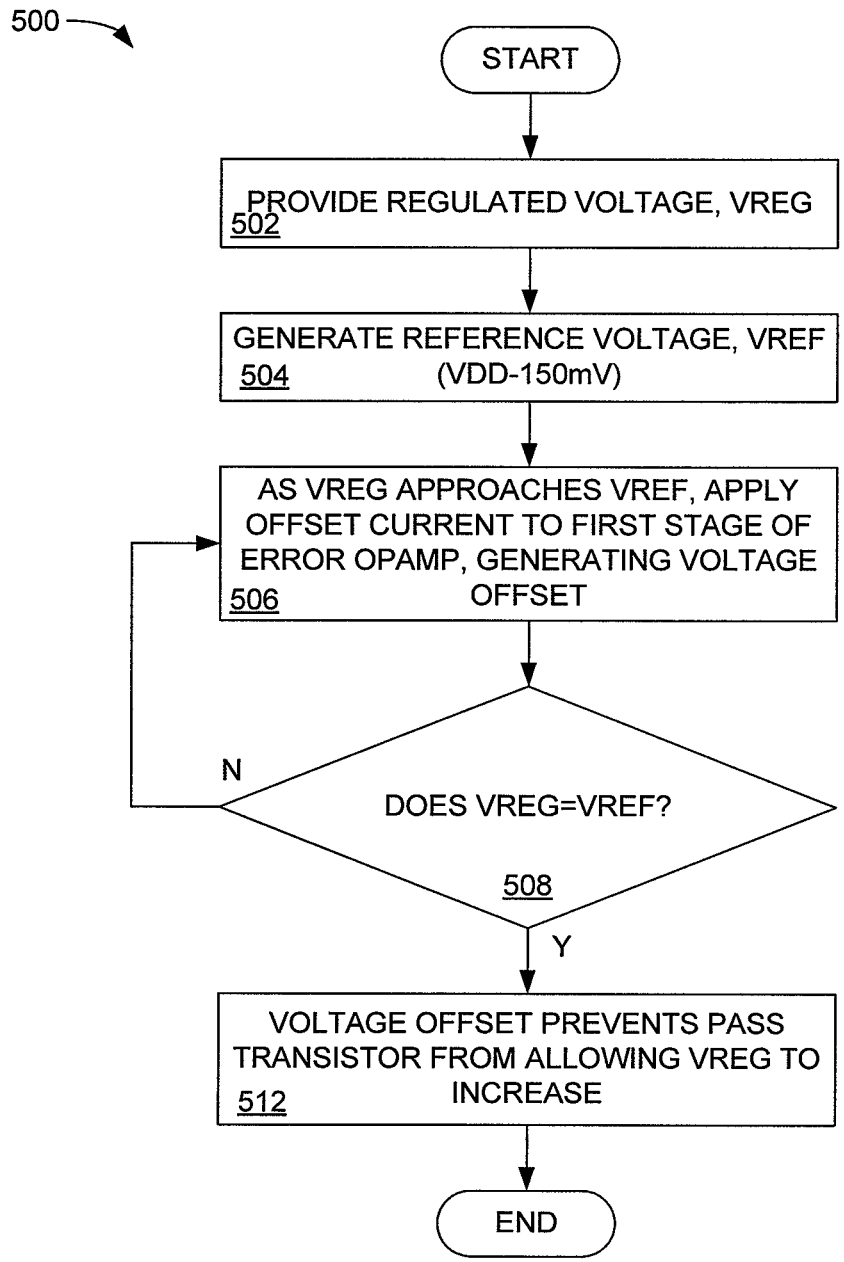
FIG. 5 is a flow chart illustrating an embodiment of a method for power amplifier over-voltage protection.

FIG. 5 is a flow chart illustrating an embodiment of a method for preventing power amplifier supply voltage saturation. The blocks in the flow chart illustrate an exemplary method and can be performed in or out of the order shown. Portions of the method for preventing power amplifier supply voltage saturation can be executed in software as known in the art.

In block 502, a regulated voltage, Vreg, is provided to a voltage saturation protection circuit. In block 504, a reference voltage is provided to the voltage saturation protection circuit. In an embodiment, the reference voltage, Vref, can be approximately 150 mV below a system supply voltage.

In block 506, as the regulated voltage, Vreg, approaches the reference voltage, Vref, an offset current, Ioffset, is applied to a first stage of a multiple stage comparator that is part of a voltage regulator.

In block 508 it is determined whether the regulated voltage, Vreg, equals the reference voltage, Vref. If the regulated voltage, Vreg, does not equal the reference voltage, Vref, the process returns to block 506. If the regulated voltage, Vreg, equals the reference voltage, Vref, then the increased current through the second and third stages of the comparator 250 (FIG. 4) causes the voltage at the gate of the pass transistor 232 to increase such that the pass transistor 232 effectively clamps the regulated voltage, Vreg, at approximately 150 mV below the system voltage $V_{DD}$ as indicated in block 512.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A system for regulating voltage, the system comprising:
    a saturation protection circuit configured to receive a reference voltage and a regulated voltage and generate an offset current signal based on comparing the reference voltage with the regulated voltage; and
    a voltage regulator having a feedback loop including a comparator configured to receive the offset current signal from the saturation protection circuit, the voltage regulator configured to generate the regulated voltage, prevent the regulated voltage from exceeding a set threshold based on the offset current signal received by the comparator, and maintain a loop gain of the feedback loop while preventing the regulated voltage from exceeding the set threshold.

2. A system for regulating voltage, the system comprising:
    a saturation protection circuit configured to receive a reference voltage and a regulated voltage and generate an offset signal based on comparing the reference voltage with the regulated voltage; and
    a voltage regulator having a feedback loop including a comparator configured to receive the offset signal from the saturation protection circuit, the voltage regulator configured to generate the regulated voltage, prevent the regulated voltage from exceeding a set threshold based on the offset signal received by the comparator, and maintain a loop gain of the feedback loop while preventing the regulated voltage from exceeding the set threshold, and the feedback loop further including a multiplier configured to compute a product of the regulated voltage and a signal that mirrors current flowing out of a transistor driving the regulated voltage by a scale factor.

3. The system of claim 1 wherein the comparator is configured to compare a power control signal with a feedback voltage of the feedback loop.

4. The system of claim 3 wherein the linear loop gain has a substantially linear relationship with the power control signal.

5. The system of claim 1 wherein the comparator includes at least a first stage configured to receive the offset signal and a subsequent stage configured to prevent the regulated voltage from exceeding the set threshold.

6. The system of claim 5 wherein the comparator includes three stages.

7. A system for regulating voltage, the system comprising:
    a saturation protection circuit configured to receive a reference voltage and a regulated voltage and generate an offset signal based on comparing the reference voltage with the regulated voltage;
    a voltage regulator having a feedback loop including a comparator configured to receive the offset signal from the saturation protection circuit, the voltage regulator configured to generate the regulated voltage, prevent the regulated voltage from exceeding a set threshold based on the offset signal received by the comparator, and maintain a loop gain of the feedback loop while preventing the regulated voltage from exceeding the set threshold; and
    a power amplifier configured to receive the regulated voltage at a collector of a bipolar transistor.

8. The system of claim 7 wherein the feedback loop includes a field transistor configured to provide the regulated voltage to the collector of the bipolar transistor via an inductor, the comparator configured to prevent the field effect transistor from operating in a triode mode of operation.

9. The system of claim 1 wherein the saturation protection circuit includes a different comparator configured to generate an error signal based on comparing the reference voltage with the regulated voltage; and a transistor configured to generate the offset signal based on the error signal.

10. The system of claim 7 wherein the offset signal is a current.

11. The system of claim 1 wherein the set threshold is the reference voltage.

12. A method of preventing voltage saturation, the method comprising:
    generating a regulated voltage using a voltage regulator having a feedback loop that includes a comparator configured to compare a power control signal with a feedback signal generated in the feedback loop;
    comparing a reference voltage with the regulated voltage using a saturation protection circuit; and
    when the reference voltage approaches the regulated voltage, applying a current generated by the saturation protection circuit to a first stage of the comparator in the feedback loop of the voltage regulator based on the comparing so as to cause a subsequent stage of the comparator in the feedback loop of the voltage regulator to prevent the regulated voltage from exceeding the reference voltage.

13. The method of claim 12 wherein the applying causes the feedback loop to maintain a substantially linear loop gain.

14. The method of claim 12 wherein the applying causes the voltage regulator to prevent a transistor driving the regulated voltage from operating in a triode mode of operation.

15. The method of claim 14 further comprising providing the regulated voltage to a power amplifier via the transistor.

16. A method of preventing voltage saturation, the method comprising:
    generating a regulated voltage using a voltage regulator having a feedback loop that includes a comparator configured to compare a power control signal with a feedback signal generated in the feedback loop;
    comparing a reference voltage with the regulated voltage using a saturation protection circuit;
    generating an error signal based on the comparing, the error signal indicative of a difference between voltage levels of the regulated voltage and the reference voltage; and
    when the reference voltage approaches the regulated voltage, applying a current generated by the saturation protection circuit based on the error signal so as to cause the comparator in the feedback loop of the voltage regulator to prevent the regulated voltage from exceeding the reference voltage.

17. A system for regulating voltage, the system comprising:
    a saturation protection circuit configured to receive a regulated voltage and a reference voltage and generate an offset current signal indicative of a difference in voltage between the regulated voltage and the reference voltage;

a transistor configured to drive the regulated voltage; and means for preventing the transistor from driving the regulated voltage at a voltage level that exceeds the reference voltage based on the offset current signal indicative of the difference in voltage between the regulated voltage and the reference voltage.

18. The system of claim 17 wherein the means for preventing are included in a feedback loop configured to maintain a substantially linear loop gain during operation.

19. The system of claim 17 wherein the means for preventing are configured to prevent the transistor from operating in a triode mode of operation.

20. The system of claim 17 further comprising a power amplifier configured to receive the regulated voltage.

21. The system of claim 17 wherein the means for preventing comprise a comparator including at least a first stage configured to receive the offset current signal indicative of the difference in voltage between the regulated voltage and the reference voltage and a subsequent stage configured to prevent the transistor from driving the regulated voltage at the voltage level that exceeds the reference voltage.

* * * * *